(12) United States Patent
Groninga et al.

(10) Patent No.: US 11,643,206 B2
(45) Date of Patent: May 9, 2023

(54) POWER LINE INSPECTION VEHICLE

(71) Applicant: Textron Innovations Inc., Providence, RI (US)

(72) Inventors: Kirk Landon Groninga, Keller, TX (US); Daniel Bryan Robertson, Southlake, TX (US); William Benjamin Johns, Little Elm, TX (US)

(73) Assignee: Textron Innovations Inc., Providence, RI (US)

( * ) Notice: Subject to any disclaimer, the term of this patent is extended or adjusted under 35 U.S.C. 154(b) by 0 days.

(21) Appl. No.: 17/902,483

(22) Filed: Sep. 2, 2022

(65) Prior Publication Data

US 2023/0002047 A1 Jan. 5, 2023

Related U.S. Application Data

(63) Continuation of application No. 16/778,269, filed on Jan. 31, 2020, now Pat. No. 11,518,512.

(51) Int. Cl.
| | |
|---|---|
| *B64C 39/02* | (2023.01) |
| *B64F 3/02* | (2006.01) |
| *G01R 31/08* | (2020.01) |
| *H02G 1/02* | (2006.01) |
| *H04N 7/18* | (2006.01) |
| *B64U 30/20* | (2023.01) |
| *B64U 50/34* | (2023.01) |
| *B64U 101/30* | (2023.01) |

(52) U.S. Cl.
CPC ............. *B64C 39/024* (2013.01); *B64F 3/02* (2013.01); *G01R 31/085* (2013.01); *H02G 1/02* (2013.01); *H04N 7/18* (2013.01); *B64U 30/20* (2023.01); *B64U 50/34* (2023.01); *B64U 2101/30* (2023.01)

(58) Field of Classification Search
CPC .... B64C 2201/066; B64U 50/34; B64U 50/35
See application file for complete search history.

(56) References Cited

U.S. PATENT DOCUMENTS

| | | |
|---|---|---|
| 4,818,990 A | 4/1989 | Fernandes |
| 4,904,996 A | 2/1990 | Fernandes |
| 7,184,072 B1 | 2/2007 | Loewen et al. |
| 8,991,273 B2 | 3/2015 | Phillips et al. |
| 9,421,869 B1 | 8/2016 | Ananthanarayanan et al. |
| 9,753,461 B1 | 9/2017 | Johnson et al. |
| 9,932,110 B2 | 4/2018 | McNally |

(Continued)

FOREIGN PATENT DOCUMENTS

| | | |
|---|---|---|
| EP | 2495166 A1 | 9/2012 |
| JP | 2016-067139 A | 4/2016 |

*Primary Examiner* — Joshua J Michener
*Assistant Examiner* — Arfan Y. Sinaki
(74) *Attorney, Agent, or Firm* — Shackelford, Bowen, McKinley & Norton, LLP

(57) ABSTRACT

An exemplary unmanned aerial vehicle (UAV) mountable to a conductor of an aerial power transmission line system includes a body having a rotor system, a motivation system attached to the body to motivate the UAV along the conductor, a battery carried by the body and electrically connected to at least one of the rotor system and the motivation system, a monitoring tool mounted with the body and an inductive coil carried by the body and in electric connection with the battery, wherein the inductive coil is configured to harvest electricity from the aerial power transmission line system and charge the battery.

20 Claims, 6 Drawing Sheets

(56) References Cited

U.S. PATENT DOCUMENTS

| | | |
|---|---|---|
| 10,099,561 B1 | 10/2018 | Ananthanarayanan et al. |
| 2006/0114122 A1 | 6/2006 | Jones |
| 2011/0196535 A1 | 8/2011 | Phillips et al. |
| 2016/0023761 A1 | 1/2016 | McNally |
| 2017/0015414 A1 | 1/2017 | Chan et al. |
| 2017/0015415 A1 | 1/2017 | Chan et al. |
| 2017/0168107 A1 | 6/2017 | Vinogradova et al. |
| 2017/0200530 A1 | 7/2017 | Davis et al. |
| 2018/0095468 A1 | 4/2018 | Yang et al. |
| 2018/0265098 A1 | 9/2018 | Evans |
| 2019/0077505 A1 | 3/2019 | Akens et al. |
| 2019/0135113 A1 | 5/2019 | Koo |
| 2019/0176984 A1 | 6/2019 | Wabnegger et al. |
| 2019/0260191 A1 | 8/2019 | Lavoie et al. |
| 2020/0001993 A1 | 1/2020 | Kirkbride |
| 2020/0391600 A1 | 12/2020 | Beranger et al. |
| 2021/0024212 A1 | 1/2021 | Andeweg |

POWER LINE INSPECTION VEHICLE

CROSS-REFERENCE TO RELATED APPLICATION

This application is a continuation of U.S. application Ser. No. 16/778,269, filed Jan. 31, 2020, the contents of which are incorporated by reference in their entirety herein for all purposes.

TECHNICAL FIELD

This disclosure relates in general to the field of aircraft, and more particularly, to unmanned aerial vehicles for inspecting aerial power line components.

BACKGROUND

This section provides background information to facilitate a better understanding of the various aspects of the disclosure. It should be understood that the statements in this section of this document are to be read in this light, and not as admissions of prior art.

Maintenance of the electric power grid system requires constant inspection. Traditionally this inspection is performed by linemen physically traversing the power lines, access from helicopters, and use of small drones. Human inspection is dangerous, expensive, and often requires that the power lines be deactivated. Drones have limited flight times and require a human operator to be within line-of-sight, reducing the applicability of drones for power line inspections.

SUMMARY

An exemplary unmanned aerial vehicle (UAV) mountable to a conductor of an aerial power transmission line system includes a body having a rotor system, a motivation system attached to the body to motivate the UAV along the conductor, a battery carried by the body and electrically connected to at least one of the rotor system and the motivation system, a monitoring tool mounted with the body and an inductive coil carried by the body and in electric connection with the battery, wherein the inductive coil is configured to harvest electricity from the aerial power transmission line system and charge the battery.

An exemplary method of inspecting an aerial power transmission line includes flying an unmanned aerial vehicle to a conductor of the aerial power transmission line system, the UAV comprising a body having a rotor assembly, a set of wheels coaxially aligned, and a battery, positioning the set of wheels on the conductor, inspecting the conductor with a monitoring tool, moving the UAV along the conductor and harvesting electricity from the aerial power transmission line system and charging the battery.

This summary is provided to introduce a selection of concepts that are further described below in the detailed description. This summary is not intended to identify key or essential features of the claimed subject matter, nor is it intended to be used as an aid in limiting the scope of claimed subject matter.

BRIEF DESCRIPTION OF THE DRAWINGS

The disclosure is best understood from the following detailed description when read with the accompanying figures. It is emphasized that, in accordance with standard practice in the industry, various features are not drawn to scale. In fact, the dimensions of various features may be arbitrarily increased or reduced for clarity of discussion.

DETAILED DESCRIPTION

Figure 1:
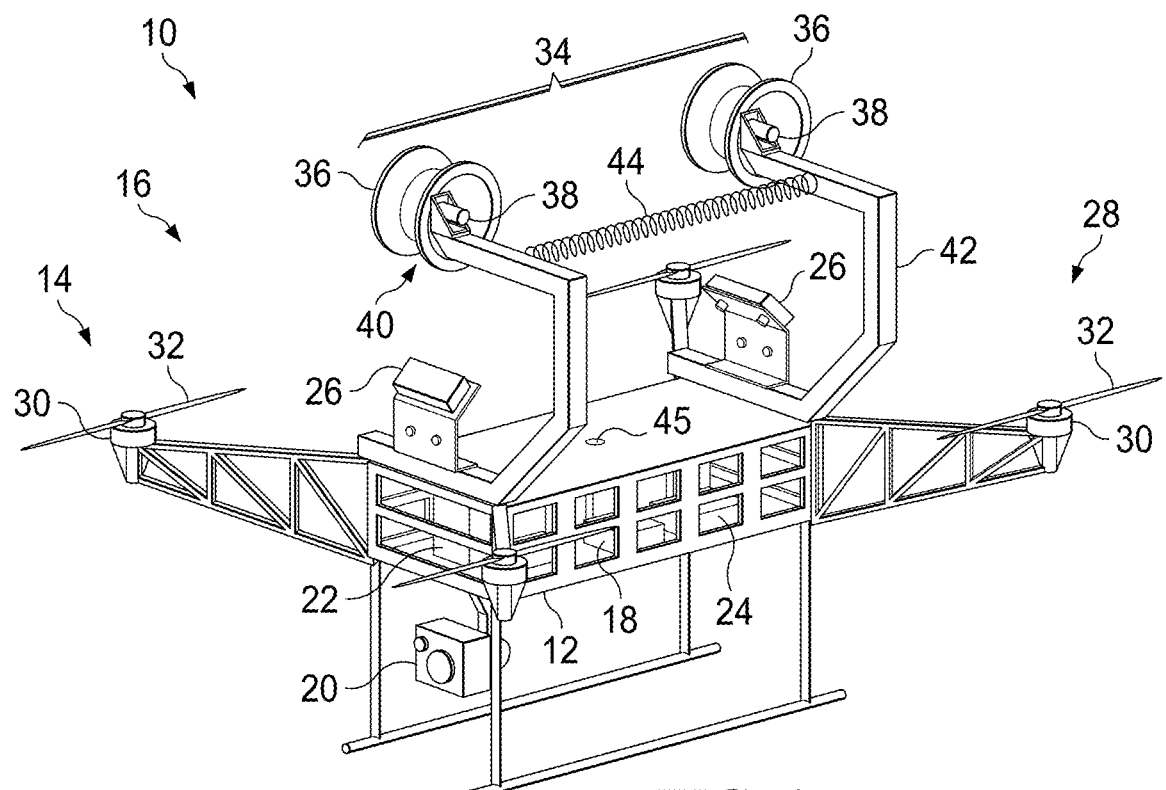
FIG. 1 illustrates an exemplary unmanned aerial vehicle according to one or more aspects of the disclosure.

It is to be understood that the following disclosure provides many different embodiments, or examples, for implementing different features of various illustrative embodiments. Specific examples of components and arrangements are described below to simplify the disclosure. These are, of course, merely examples and are not intended to be limiting. For example, a figure may illustrate an exemplary embodiment with multiple features or combinations of features that are not required in one or more other embodiments and thus a figure may disclose one or more embodiments that have fewer features or a different combination of features than the illustrated embodiment. Embodiments may include some but not all the features illustrated in a figure and some embodiments may combine features illustrated in one figure with features illustrated in another figure. Therefore, combinations of features disclosed in the following detailed description may not be necessary to practice the teachings in the broadest sense and are instead merely to describe particularly representative examples. In addition, the disclosure may repeat reference numerals and/or letters in the various examples. This repetition is for the purpose of simplicity and clarity and does not itself dictate a relationship between the various embodiments and/or configurations discussed.

In the specification, reference may be made to the spatial relationships between various components and to the spatial orientation of various aspects of components as the devices are depicted in the attached drawings. However, as will be recognized by those skilled in the art after a complete reading of the present application, the devices, members, apparatuses, etc. described herein may be positioned in any desired orientation. Thus, the use of terms such as "inboard," "outboard," "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction. As used herein, the terms "connect," "connection," "connected," "in connection with," and "connecting" may be used to mean in direct connection with or in connection with via one or more elements. Similarly, the terms "couple," "coupling," and "coupled" may be used to mean directly coupled or coupled via one or more elements.

With reference to the figures, FIG. 1 illustrates an exemplary unmanned aerial vehicle (UAV), generally denoted by the numeral 10, that is mountable to a conductor of an aerial power transmission line system. UAV 10 includes a body 12 having a rotor system 14, a motivation system 16 attached to the body to motivate the UAV along the conductor, a battery 18 carried by the body and electrically connected to at least one of the rotary system 14 and the motivation system 16, one or more monitoring tools 20 mounted with the body, and an energy harvesting system 22 configured to harvest electricity from the aerial power transmission line system and charge battery 18 and or to power one or more of the UAV systems directly. UAV 10 includes avionics, such a processor 24, e.g. controller, in communication with the various UAV systems and having software and instructions for operating UAV 10 in response to instructions from a local or remote operator and/or to operate autonomously. UAV 10 may include navigation sensors 26, such as global positioning sensors and proximity sensors, in communication with processor 24. Processor 24 is configured to communicate with a remote site to transmit data from the one or more monitoring tools 20 and or receive instructions.

Rotor system 14 includes rotor assemblies 28 including motors 30 driving rotor blades 32. Rotor assemblies 28 may be gimballed. Motors 30 are electrically connected to battery 18 and or electricity harvesting system 22. Those skilled in the art with benefit of this disclosure will understand that battery 18 includes other electric storage devices, such as capacitors.

Motivation system 16 is configured to physically contact the aerial conductor (transmission line) and support the weight of the UAV and in some embodiments move UAV 10 along the aerial conductor. Motivation system 16 includes a set 34 of wheels 36 that are coaxially aligned to engage the same conductor. In the illustrated embodiment, UAV 10 has a single set 34 of wheels to engage and support UAV 10 on a single conductor. The exemplary set 34 of wheels 36 has two wheels 36; however, the set of wheels may have more than two wheels. Additional co-axial wheels 36 may facilitate stability when motivation system 16 is used to move UAV 10 across a power line component such as a splice, suspender clamp, or cable spacer. In some embodiments, wheels 36 are electrically driven to rotate and to move UAV 10 along a conductor. In the illustrated example, each wheel 36 includes a motor 38. Wheels 36 may include V-shaped grooves 40 to engage the conductor and conductor components.

Wheels 36 are connected to body 12 by arms 42. Arms 42 position wheels 36 above body 12. The center of gravity 45 of UAV 10 is positioned in the same plane as co-axial set 34 of wheels so that a single set 34 of wheels 36 support UAV 10 from a single conductor.

UAV 10 may include one or more monitoring tools 20. In FIG. 1, UAV 10 includes a camera for a monitoring tool. The camera may be an infrared camera. Monitoring tool 20 may be gimballed to provide visual coverage of the components to be visually inspected. For example, monitoring tool 20 may be used to inspect and monitor the conductor from which the UAV is suspended, adjacent conductors, conductor components, suspension towers and the like. Monitoring tools 20 may include other sensors and devices used to inspect and monitor aerial transmission line systems.

Figure 2:
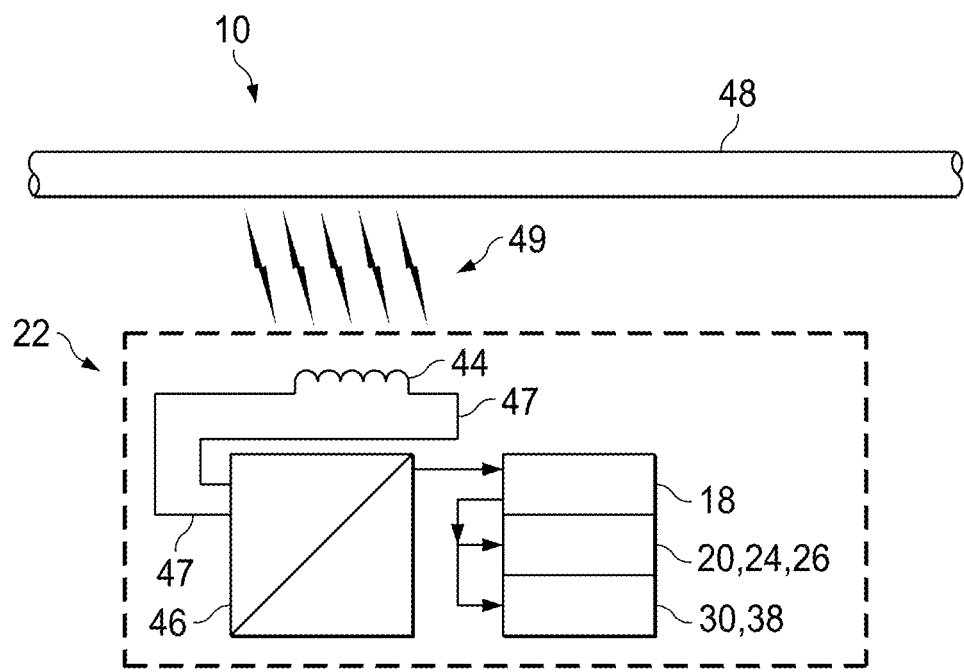
FIG. 2 illustrates an exemplary energy harvesting system according to one or more aspects of the disclosure.

An exemplary energy harvesting system 22 is now described with reference to FIGS. 1 and 2. With additional reference to the other figures, energy harvesting system 22 includes a coil 44, for example open air or magnetic core, and an AC/DC power rectifier 46. In the exemplary embodiment of FIG. 1, coil 44 is positioned at wheels 36 so as to be in close proximity to the AC power transmission line 48. For example, coil 44 extends between the legs 42 connecting the set of wheels to body 12. Wires 47 may extend from coil 44 through legs 42 to the AC/DC power rectifier 46 positioned in body 12 (e.g., frame) with the battery and other avionics. When UAV 10 is proximate to an AC transmission line 48, i.e. conductor, a portion of the magnetic field 49 generated by transmission line 48 is converted by harvesting system 22 into power. The rectified power is used by battery 18 management system to recharge the batteries for use by UAV systems, such as rotor motors 30, wheel motors 38, controller 24, and monitoring tools 20 and sensors 26.

A method of inspecting an aerial power transmission line system 50 is now described with reference to FIGS. 1-7. Aerial power transmission line system 50 includes one or more power lines, generally referred to as conductor 48, suspended above ground 52 by suspension towers 54. Aerial power transmission line system 50 is illustrated herein as a high-voltage system, however, UAV 10 and the methods disclosed herein may be used in other systems. Aerial power transmission line system 50 may include various components, generally denoted 56, that need to be inspected and the components may be an obstacle to be navigated by UAV 10. A non-exclusive list of components 56 includes conductor splices, connectors, cable-spacers, dampers, suspension towers, suspension clamps, and marker balls. As will be understood by those skilled in the art with benefit of this disclosure, UAV 10 may navigate around, over, or past these components, e.g. obstacles, by operating the wheels to drive across the component and by operation of the rotor assemblies to fly around the component or to aide in powering the UAV across the component with the wheels contacting the conductor and the component. As is well known, conductors 48 have spans that have downgrades 58 where the conductor is declined downward from the tower in the direction of the UAV travel and inclines 60 where the UAV has to travel upward on the conductor. In accordance to some embodiments, the UAV rotor assemblies may be operated to brake and slow the descent of the UAV on downgrades 58 and the UAV rotor assemblies may be operated to help the UAV climb inclines 60 while maintaining wheels 36 on the conductor.

Figure 3:
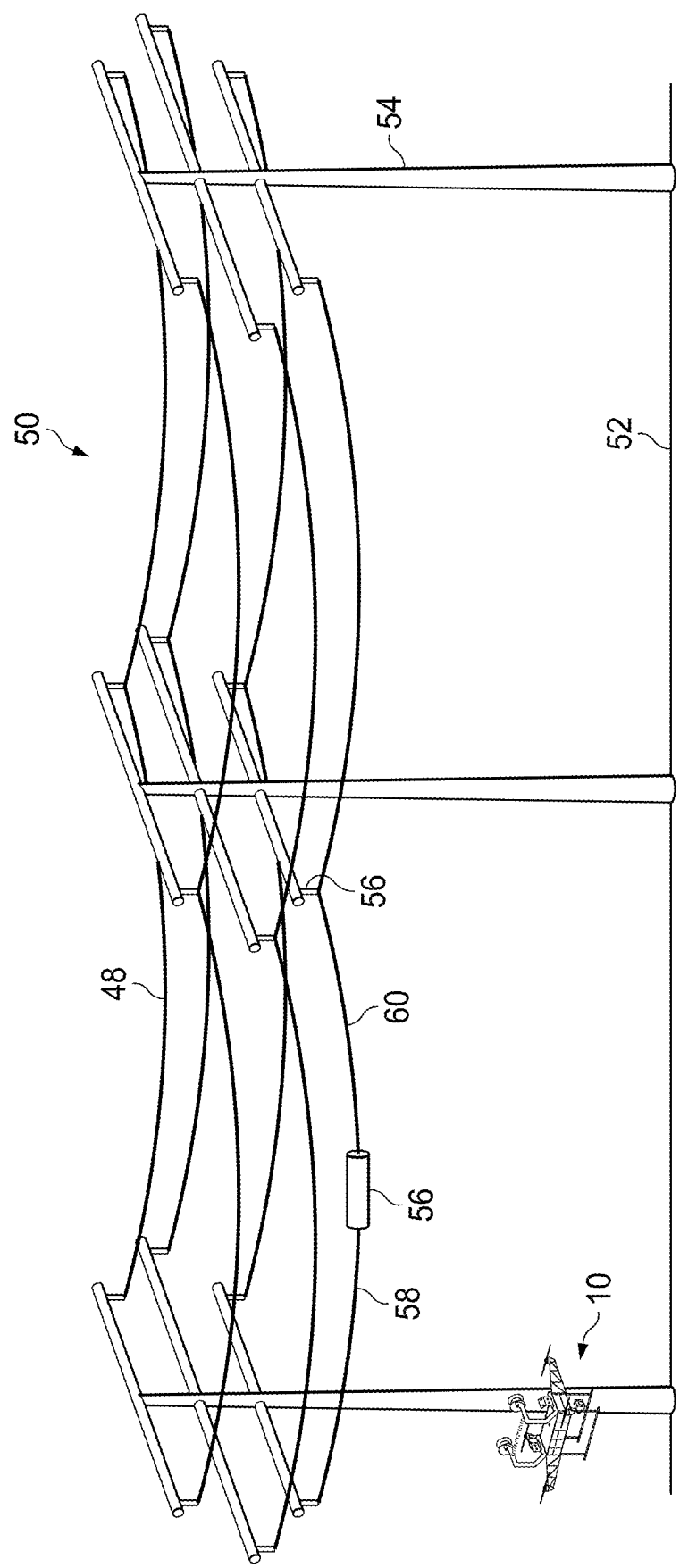
FIGS. 3-7 illustrate an exemplary unmanned aerial vehicle traversing and inspecting an aerial power transmission line system.
Figure 4:
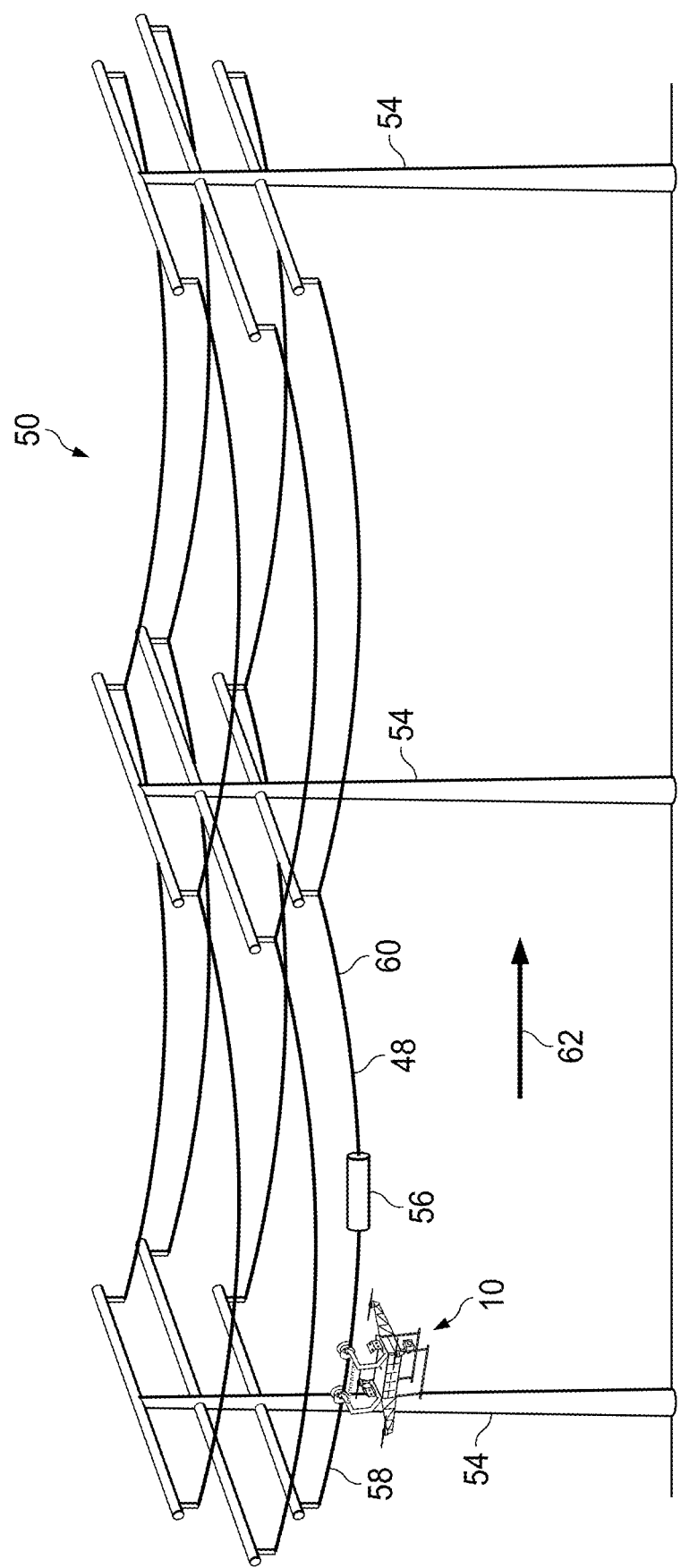

At FIG. 3, UAV 10 is deployed from the ground 52 and flown to and landed on a conductor 48, shown in FIG. 4. UAV 10 is landed by suspending UAV 10 on conductor 48 by set 34 of wheels 36. In this example, UAV 10 is suspended from a single conductor 48. UAV 10 may be deployed in direct response from an operator or UAV 10 may be self-deployed, for example, in response to instructions included in the on-board processors. In accordance to some embodiments, UAV 10 may be self-deployed and autonomous for example to continuously monitor a section of a transmission line. Monitoring tools 20 may be operated to inspect conductor 48 and components of transmission line system 50 when UAV 10 is proximate to system 50 as well as when UAV is suspended from a conductor.

Figure 5:
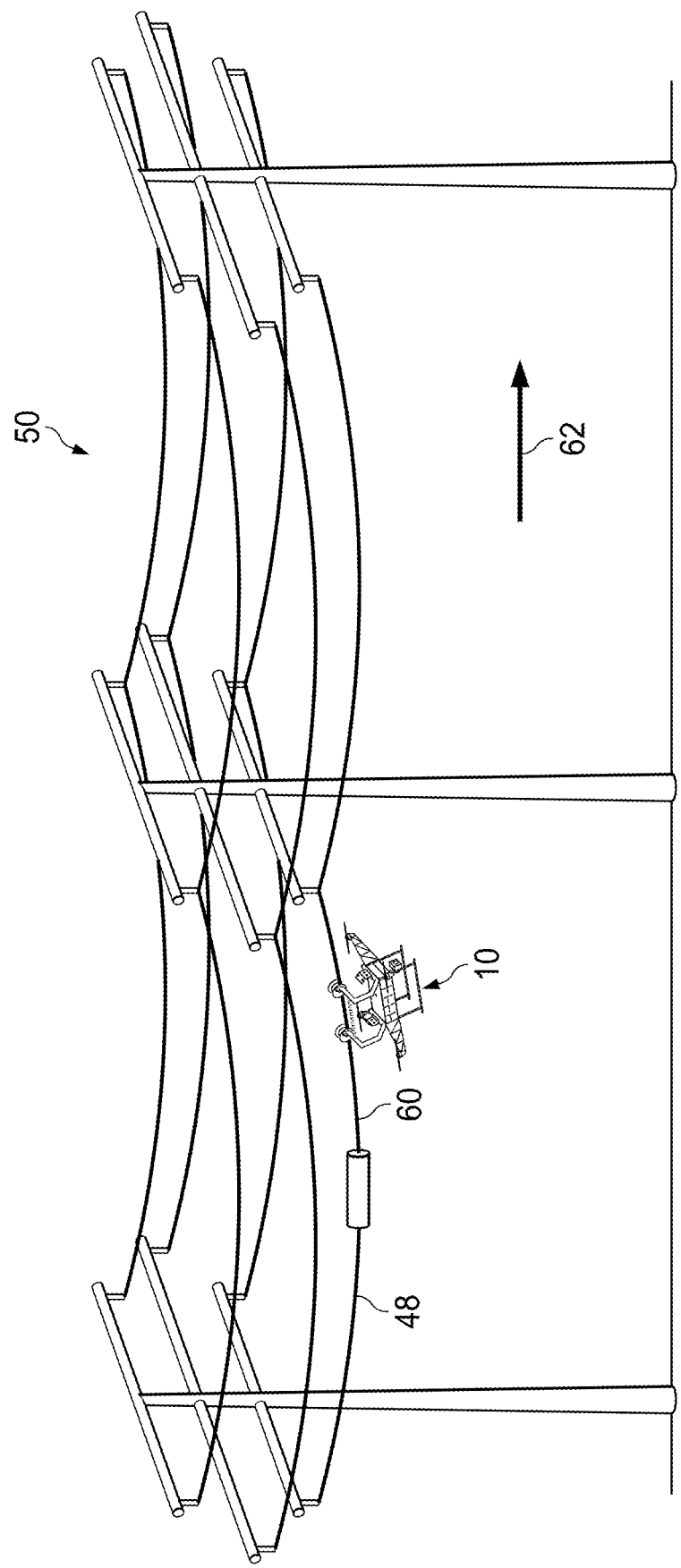

With reference to FIGS. 4 and 5, UAV 10 is being moved along conductor 48 in the direction 62. UAV 10 may be moved in the direction 62 by electrically driving one or more of the wheels of the set of wheels. When descending downgrade 58, the rotor assemblies may be driven to brake and slow the descent of UAV 10. In FIGS. 4 and 5, UAV 10 passes over a component 56, such as a cable splice. In this example, UAV 10 passes over component 56 while maintaining wheels 36 on conductor 48. FIG. 5 illustrates UAV 10 ascending incline 60. UAV 10 may operate the rotor assemblies to provide upward lift along incline 60.

Figure 6:
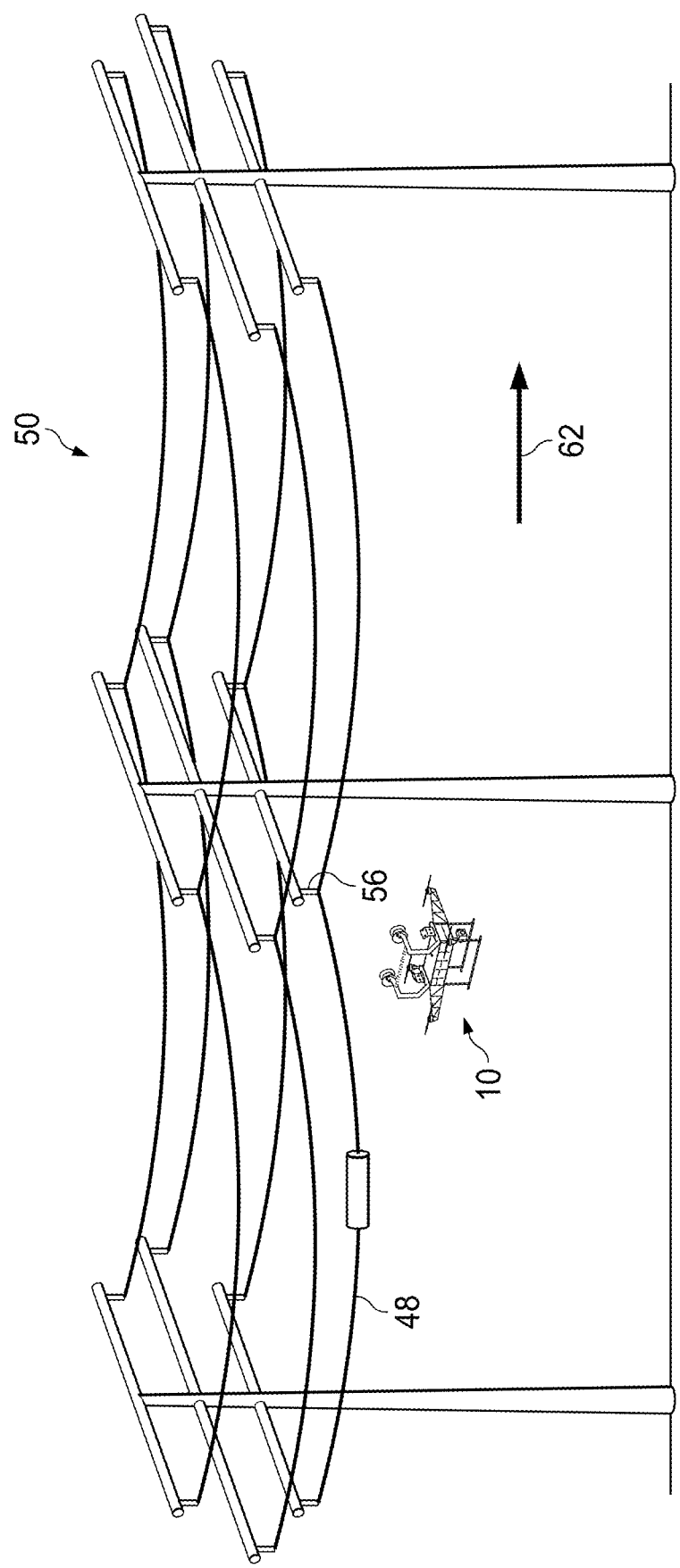
Figure 7:
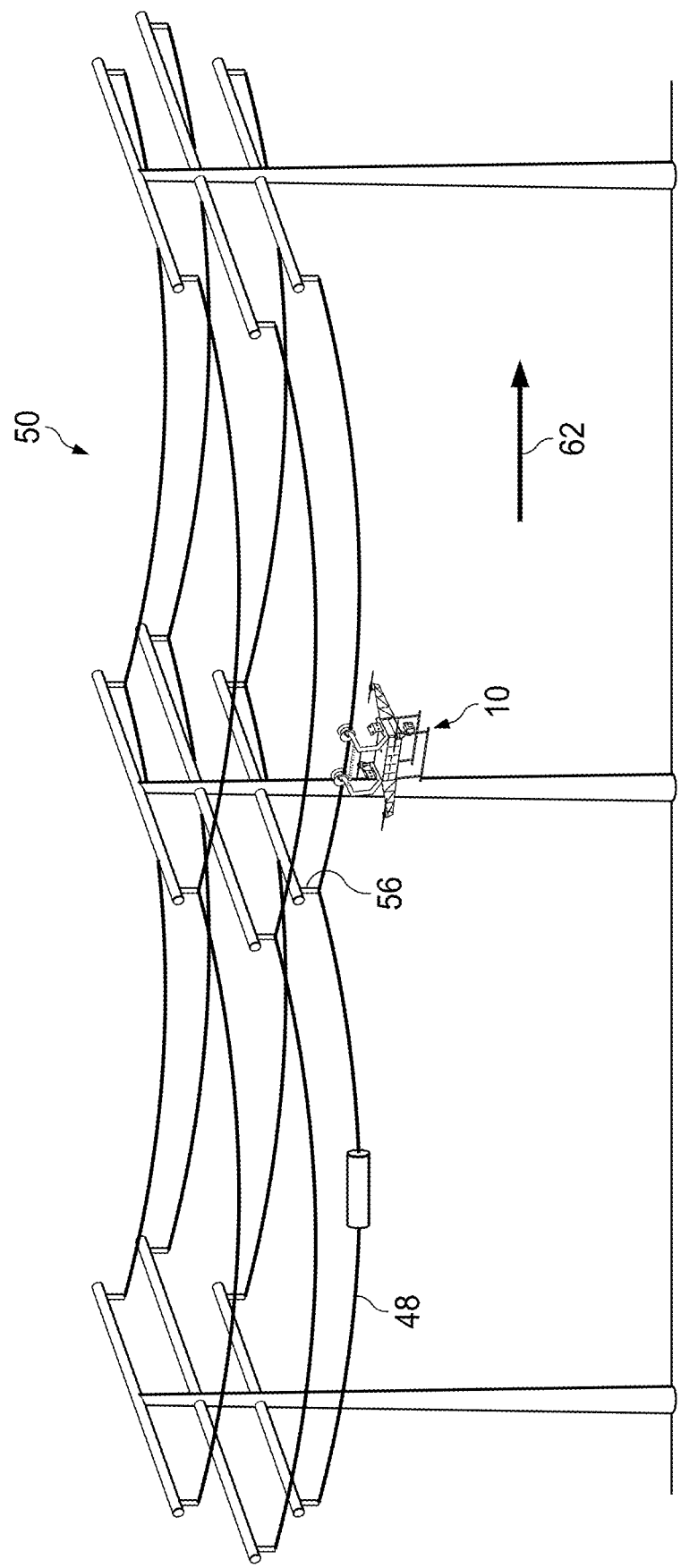

FIGS. 6 and 7 illustrates UAV 10 navigating past a component 56 by flying around the component. As UAV 10 approaches the obstacle component 56, the rotor assemblies are operated to lift UAV 10 off of the conductor 48 on a first side (FIG. 6) of the obstacle and to fly around the obstacle component 56 and land on the conductor 48 on the second side (FIG. 7) of the obstacle. Monitoring tools 20, in particular a camera can be operated to inspect the system when UAV is removed from conductor 48.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include such elements or features.

The term "substantially," "approximately," and "about" is defined as largely but not necessarily wholly what is specified (and includes what is specified; e.g., substantially 90 degrees includes 90 degrees and substantially parallel includes parallel), as understood by a person of ordinary skill in the art. The extent to which the description may vary will depend on how great a change can be instituted and still have a person of ordinary skill in the art recognized the modified feature as still having the required characteristics and capabilities of the unmodified feature. In general, but subject to the preceding, a numerical value herein that is modified by a word of approximation such as "substantially," "approximately," and "about" may vary from the stated value, for example, by 0.1, 0.5, 1, 2, 3, 4, 5, 10, or 15 percent.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure and that they may make various changes, substitutions, and alterations without departing from the spirit and scope of the disclosure. The scope of the invention should be determined only by the language of the claims that follow. The term "comprising" within the claims is intended to mean "including at least" such that the recited listing of elements in a claim are an open group. The terms "a," "an" and other singular terms are intended to include the plural forms thereof unless specifically excluded.

What is claimed is:

1. An unmanned aerial vehicle (UAV) mountable to a conductor of an aerial power transmission line system, the UAV comprising:
   a body having a rotor system;
   a plurality of arms connected to the body;
   a battery carried by the body and electrically connected to the rotor system;
   a monitoring tool mounted with the body;
   an inductive coil carried by the body and in electric connection with the battery; and
   wherein the inductive coil extends between the plurality of arms and is configured to harvest electricity from the aerial power transmission line system and charge the battery.

2. The UAV of claim 1, comprising:
   a motivation system attached to the body to motivate the UAV along the conductor; and
   wherein the motivation system comprises a single set of wheels coaxially aligned to engage the conductor.

3. The UAV of claim 2, wherein:
   the single set of wheels are positioned above the body; and
   a center of gravity of the UAV is located in a same plane as the single set of wheels.

4. The UAV of claim 2, wherein the motivation system comprises a first wheel and a second wheel coaxially aligned to engage the conductor, wherein the UAV has a center of gravity positioned vertically below and in a same plane as the first wheel and the second wheel; and
   the first wheel and the second wheel each comprising a motor electrically coupled to the battery.

5. The UAV of claim 2, wherein the rotor system comprises rotor assemblies positioned below the motivation system.

6. The UAV of claim 2, wherein the body carries a controller in communication with the rotor system and the motivation system to autonomously maneuver the UAV.

7. The UAV of claim 6, further comprising navigation sensors mounted with the body and in communication with the controller.

8. The UAV of claim 2, wherein:
   the motivation system comprises a single set of wheels coaxially aligned to engage the a conductor and positioned above the body, each wheel of the single set of wheels comprising a motor electrically coupled to the battery;
   a center of gravity of the UAV is positioned below and in a same plane as the single set of wheels; and
   the inductive coil is positioned proximate to the single set of wheels.

9. The UAV of claim 8, wherein:
   the body carries a controller in communication with the rotor system and the motivation system to autonomously maneuver the UAV; and
   navigation sensors mounted with the body and in communication with the controller.

10. The UAV of claim 1, wherein the monitoring tool comprises a camera.

11. A method of inspecting an aerial power transmission line system, the method comprising:
    flying an unmanned aerial vehicle (UAV) to a conductor of the aerial power transmission line system, the UAV comprising a body having a rotor assembly, a set of wheels coaxially aligned, and a battery;
    positioning the set of wheels on the conductor;
    inspecting the conductor with a monitoring tool; and
    harvesting, using a coil that extends between a plurality of arms connected to the body, electricity from the aerial power transmission line system and charging the battery.

12. The method of claim 11, comprising:
    moving the UAV along the conductor; and
    wherein the moving the UAV along the conductor comprises driving the set of wheels.

13. The method of claim 11, comprising:
    moving the UAV along the conductor; and
    wherein the moving the UAV along the conductor comprises operating the rotor assembly while the set of wheels is positioned on the conductor.

14. The method of claim 11, wherein the harvesting electricity comprises positioning a coil proximate to the conductor.

15. The method of claim 11, comprising:
    moving the UAV along the conductor;
    wherein the moving the UAV along the conductor comprises moving the UAV along a portion of the conductor by driving the set of wheels while not operating the rotor assembly; and moving the UAV along another portion of the conductor, with the set of wheels on the conductor, by operating the rotor assembly.

16. The method of claim 11, further comprising traveling past an obstruction on the conductor by operating the rotor assembly to lift the set of wheels off of the conductor on a first side of the obstruction and landing the set of wheels on the conductor on a second side of the obstruction.

17. The method of claim 11, wherein the set of wheels are positioned above the body and a center of gravity of the UAV is positioned in a same plane as the set of wheels.

18. The method of claim 17, further comprising traveling past an obstruction on the conductor by operating the rotor assembly to lift the set of wheels off of the conductor on a first side of the obstruction and landing the set of wheels on the conductor on a second side of the obstruction.

19. The method of claim 17, comprising:
moving the UAV along the conductor; and
wherein the moving the UAV along the conductor comprises moving the UAV up an incline by operating the rotor assembly and maintaining the set of wheels on the conductor.

20. The method of claim 17, wherein the harvesting electricity comprises positioning a coil proximate to the conductor.

\* \* \* \* \*